United States Patent
Chen et al.

(10) Patent No.: US 11,121,252 B2
(45) Date of Patent: Sep. 14, 2021

(54) LDMOS DEVICE AND MANUFACTURING METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Deyan Chen, Shanghai (CN); Mao Li, Shanghai (CN); Leong Tee Koh, Shanghai (CN); Dae-Sub Jung, Shanghai (CN)

(73) Assignees: Semiconductor Manufacturing (Beijing) Intel Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 0 days.

(21) Appl. No.: 16/601,820

(22) Filed: Oct. 15, 2019

(65) Prior Publication Data
US 2020/0273989 A1 Aug. 27, 2020

(30) Foreign Application Priority Data
Feb. 26, 2019 (CN) .......................... 201910141854.4

(51) Int. Cl.
H01L 29/78 (2006.01)
H01L 29/66 (2006.01)
H01L 29/40 (2006.01)

(52) U.S. Cl.
CPC ........ *H01L 29/7816* (2013.01); *H01L 29/402* (2013.01); *H01L 29/66681* (2013.01)

(58) Field of Classification Search
None
See application file for complete search history.

(56) References Cited

U.S. PATENT DOCUMENTS

2017/0263761 A1* 9/2017 Hu .................... H01L 29/42376
2017/0278963 A1* 9/2017 Liu .................... H01L 21/76897

\* cited by examiner

*Primary Examiner* — Nicholas J Tobergte
*Assistant Examiner* — Kien C Ly

(57) ABSTRACT

The present disclosure provides an LDMOS device and a manufacturing method thereof. The LDMOS device includes: a substrate, a drift region formed in the substrate; a gate structure, located on the substrate on one side of the drift region, and covering part of the drift region; a drain region, located in the drift region on one side of the gate structure, an isolation structure located on the substrate, the isolation structure located between the drain region and the gate structure; a gate electrode, located on the gate structure and electrically connected with the gate structure; a drain electrode, located on the drain region and electrically connected with the drain region; a block layer, covering the drift region and the isolation structure between the gate electrode and the drain electrode in a shape-preserving manner; and a groove electrode located on the block layer, the groove electrode located between the isolation structure and the gate structure, and at least covering part of the top of the isolation structure. The LDMOS device improves a device breakdown voltage, and cannot increase Rdson.

9 Claims, 7 Drawing Sheets

LDMOS DEVICE AND MANUFACTURING METHOD THEREOF

RELATED APPLICATIONS

The present application claims priority to Chinese Patent Appln. No. 201910141854.4, filed Feb. 26, 2019, the entire disclosure of which is hereby incorporated by reference.

BACKGROUND

Technical Field

Embodiments and implementations of the present disclosure relates to the field of semiconductor manufacturing, and particularly relates to an LDMOS device and a manufacturing method thereof.

Related Art

An LDMOS (Laterally Diffused Metal Oxide Semiconductor) transistor is widely applied into a power integrated circuit because it is easier to be compatible with a logic process of CMOS (Complementary Metal Oxide Semiconductors). In the power integrated circuit, a BVDss-Rdson characteristic of a device has important significance for designing efficient power application circuits.

Generally, Rdson and BVDss of an LDMOS are two mutually restricted performances. If Rdson is decreased, BVDss is very likely to be lowered, and vice versa. Thus, how to improve BVDss, but not increase Rdson becomes a problem urgently needing to be solved.

SUMMARY

The present disclosure provides embodiments and implementations of an LDMOS device and manufacturing methods thereof, where a device breakdown voltage is increased, and Rdson is not increased.

In order to address the above problem, one form of the present disclosure provides an LDMOS device. The LDMOS device may include: a substrate with a drift region formed in the substrate; a gate structure, located on the substrate on one side of the drift region, and covering part of the drift region; a drain region, located in the drift region on one side of the gate structure; an isolation structure located on the substrate, the isolation structure located between the drain region and the gate structure; a gate electrode, located on the gate structure and electrically connected with the gate structure; a drain electrode, located on the drain region and electrically connected with the drain region; a block layer, covering the drift region and the isolation structure between the gate electrode and the drain electrode in a shape-preserving manner; and a groove electrode located on the block layer, the groove electrode located between the isolation structure and the gate structure, and at least covering part of the top of the isolation structure.

The present disclosure further provides manufacturing methods of an LDMOS device. In one form, a manufacturing method includes: providing a substrate with a drift region formed in the substrate; forming a gate structure on the substrate, the gate structure located on one side of the drift region and covering part of the drift region; forming an isolation structure on the substrate, the isolation structure located on the drift region; forming a drain region in the drift region on one side of the gate structure, the drain region isolated from the gate structure, where the isolation structure is located between the gate structure and the drain region, and the isolation structure is isolated from the gate structure; after forming the gate structure, the isolation structure and the drain region, forming a block layer covering the drift region and the isolation structure in a shape-preserving manner; and after forming the block layer, forming a drain electrode, a gate electrode and a groove electrode, where the drain electrode is located on the top of the drain region and electrically connected with the drain region, the gate electrode is located on the top of the gate structure and electrically connected with the gate structure, and the groove electrode is located on the block layer between the isolation structure and the gate structure, and at least covers part of the top of the isolation structure.

Compared with the prior art, a technical solution of embodiments and implementations of the present disclosure have the following advantages:

The present disclosure provides a LDMOS device and a manufacturing method thereof, where an isolation structure located between the drain region and the gate structure is formed on the substrate, the groove electrode is enabled to be located between the isolation structure and the gate structure, and at least cover part of the top of the isolation structure, that is, the isolation structure is arranged between a side, facing the drain region, below the groove electrode and the substrate, and the isolation structure and the block layer are equivalent to an isolation layer located between the side, facing the drain region, below the groove electrode and the substrate. Compared with a scheme that the isolation layer only includes the block layer, due to arrangement of the isolation structure, a thickness of the isolation layer between the side, facing the drain region, below the groove electrode and the substrate is increased, so that the position is not prone to breakdown, and then a device breakdown voltage is improved.

Meanwhile, embodiments and implementations of the present disclosure does not change other parts (such as functional region layout in the substrate, ion implantation concentration of each functional region, and an electrode structure of a gate, source and drain) in a semiconductor structure, and thus Rdson of the device is not increased, so that the Rdson is not increased while forms of the LDMOS device in the present disclosure improve the device breakdown voltage.

DETAILED DESCRIPTION

Figure 1:
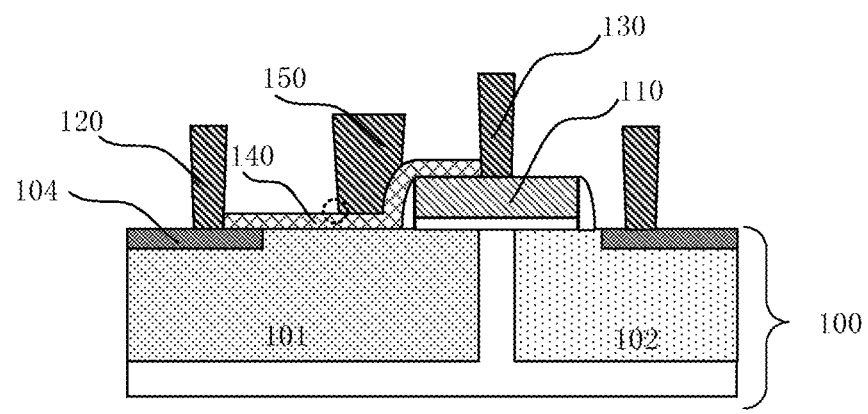
FIG. 1 is a structural schematic view of one form of a LDMOS device.

FIG. 1 illustrates a structural schematic view of an LDMOS device. The LDMOS device includes: a substrate 100, a drift region 101 and a well region 102 isolated from each other formed in the substrate 100; a gate structure 110, located at a junction of the drift region 101 and the well region 102 and covering part of the drift region 101 and the well region 102; a drain region 104, located in the drift region 101 on one side of the gate structure 110, the drain region 104 isolated from the gate structure 110; a drain electrode 120, located on the drain region 104 and electrically connected with the drain region 104; a gate electrode 130, located on the gate structure 110 and electrically connected with the gate structure 110; a salicide block (SAB) layer 140, located on the drift region 101 and the gate structure 110 between the drain electrode 120 and the gate electrode 130; and a groove electrode 150 located on the SAB layer 140 on one side of the gate structure 110.

The groove electrode 150 is used for being connected with a common electrode or a zero potential. When the device is powered on, a transverse electric field is formed between the groove electrode 150 and the drain region 104, so that the groove electrode 150 shares part of the electric field of the drain region 104, the electric field borne by the gate structure 110 is decreased, and therefore, the breakdown voltage is improved.

However, in the LDMOS device of the structure, a side, facing the drain region 104, of the groove electrode 150 is prone to breakdown. It is found that through research, a corner position (a portion in a dotted line circle as shown in FIG. 1) of a side, facing the drain region 104, below the groove electrode 150 is a shortest distance from the electric field, charges are easily gathered, and therefore the SAB layer of the portion is prone to breakdown.

Based on this, the present disclosure provides LDMOS devices and manufacturing methods thereof. In one form, a LDMOS device includes: a substrate with a drift region formed in the substrate; a gate structure, located on the substrate on one side of the drift region, and covering part of the drift region; a drain region, located in the drift region on one side of the gate structure; an isolation structure located on the substrate, the isolation structure located between the drain region and the gate structure; a gate electrode, located on the gate structure and electrically connected with the gate structure; a drain electrode, located on the drain region and electrically connected with the drain region; a block layer, covering the drift region and the isolation structure between the gate electrode and the drain electrode in a shape-preserving manner; and a groove electrode located on the block layer, the groove electrode located between the isolation structure and the gate structure, and at least covering part of the top of the isolation structure.

The present disclosure provides LDMOS devices and manufacturing methods thereof. The isolation structure located between the drain region and the gate structure is formed on the substrate, the groove electrode is enabled to be located between the isolation structure and the gate structure, and at least cover part of the top of the isolation structure, that is, the isolation structure is arranged between a side, facing the drain region, below the groove electrode and the substrate, and the isolation structure and the block layer are equivalent to an isolation layer located between the side, facing the drain region, below the groove electrode and the substrate. Compared with a scheme that the isolation layer only includes the block layer, due to arrangement of the isolation structure, a thickness of the isolation layer between the side, facing the drain region, below the groove electrode and the substrate is increased, so that the position is not prone to breakdown, and then a device breakdown voltage is improved.

Meanwhile, embodiments and implementations of the present disclosure do not change other parts (such as functional region layout in the substrate, ion implantation concentration of each functional region, and an electrode structure of a gate, source and drain) in a semiconductor structure, and thus Rdson of the device is not increased, so that the Rdson is not increased while the LDMOS device improves the device breakdown voltage.

In order to make the objectives, characteristics and advantages of the present disclosure more obvious and understandable, specific embodiments and implementations of the present disclosure are illustrated in detail below in conjunction with the drawings.

Figure 2:
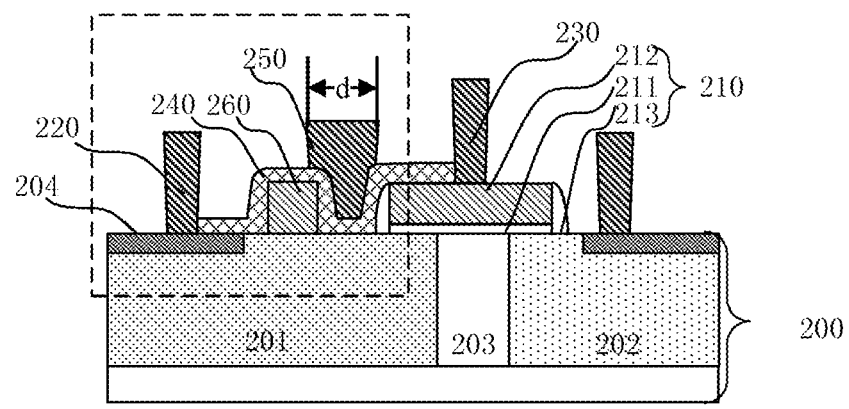
FIG. 2 is a structural schematic view of the LDMOS device.
Figure 3:
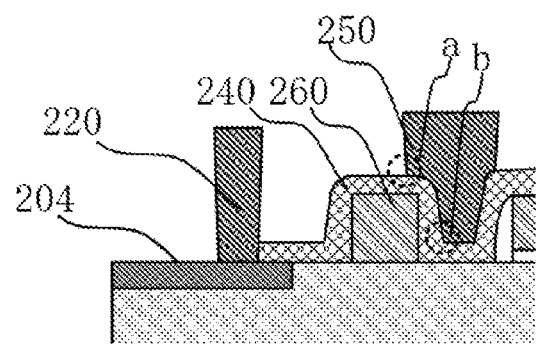
FIG. 3 is a partial enlarged view of a structure in a dotted line frame in FIG. 2.

Referring to FIG. 2 to FIG. 3, FIG. 2 is a structural schematic view of one form an LDMOS device, and FIG. 3 is a partial enlarged view of a structure in a dotted line frame in FIG. 2.

The LDMOS device includes: a substrate 200, a drift region 201 formed in the substrate 200; a gate structure 210, located on the substrate 200 on one side of the drift region 201, and covering part of the drift region 201; a drain region 204, located in the drift region 201 on one side of the gate structure 210; an isolation structure 260 located on the substrate 200, the isolation structure 260 located between the drain region 204 and the gate structure 210; a gate electrode 230, located on the gate structure 210 and electrically connected with the gate structure 210; a drain electrode 220, located on the drain region 204 and electrically connected with the drain region 204; a block layer 240, covering the drift region 201 and the isolation structure 260 between the gate electrode 230 and the drain electrode 220 in a shape-preserving manner; and a groove electrode 250 located on the block layer 240, the groove electrode 250 located between the isolation structure 260 and the gate structure 210, and at least covering part of the top of the isolation structure 260.

In some implementations, the isolation structure 260 located between the drain region 204 and the gate structure 210 is formed on the substrate 200, the groove electrode 250 is enabled to be located between the isolation structure 260 and the gate structure 210, and at least cover part of the top of the isolation structure 260, that is, the isolation structure 260 is arranged between a side, facing the drain region 204, below the groove electrode 250 and the substrate 200, and the isolation structure 260 and the block layer 240 are equivalent to an isolation layer located between the side, facing the drain region 204, below the groove electrode 250 and the substrate 200. Compared with a scheme that the isolation layer only includes the block layer, due to arrangement of the isolation structure 260, a thickness of the isolation layer between the side, facing the drain region 204, below the groove electrode 250 and the substrate 200 is increased, so that the position is not prone to breakdown, and then a device breakdown voltage is improved.

Meanwhile, present disclosure does not change other parts (such as functional region layout in the substrate, ion implantation concentration of each functional region, and an electrode structure of a gate, source and drain) in a semiconductor structure, and thus Rdson of the device is not increased, so that the Rdson is not increased while the LDMOS device improves the device breakdown voltage.

In some implementations, a material of the substrate 200 is silicon. In some other implementations, the material of the substrate can also be other materials such as germanium, silicon germanide, silicon carbide, gallium arsenide or indium gallium, and the substrate can also be substrates in other types such as a silicon substrate on an insulator or a germanium substrate on the insulator. The substrate can also be a P type substrate or an N type substrate with light doping, and those skilled in the art can perform selection according to actual requirements.

The drift region 201 is formed in the substrate 200, and low-concentration impurities in a first conductive type are doped in the drift region 201. The first conductive type can be any one of an N type or a P type. In some implementations, with the subsequently formed LDMOS device being a PMOS as an example, the first conductive type is the P type, and the doped impurities in the first conductive type can be boron, gallium, indium or the like.

Besides, in some implementations, a well region 202 is further formed in the substrate 200, the well region 202 is located on one side of the drift region 201 and isolated from the drift region 201, and low-concentration impurities in a second conductive type are doped in the well region 202. The second conductive type is opposite to the first conductive type, for example, when the first conductive type is the N type, the second conductive type is the P type. In some implementations, the first conductive type is the P type, the second conductive type is correspondingly the N type, and the doped impurities in the second conductive type can be phosphorus, arsenic, antimony or the like.

In some implementations, a body region 203 is formed between the drift region 201 and the well region 202, and the body region 203 is a region of the substrate 200 without performing further doping. In other implementations of the present disclosure, there may be no body region arranged between the drift region and the well region.

The gate structure 210 is arranged on the substrate 200 on one side of the drift region 201, and the gate structure 210 covers part of the drift region 201. In some implementations, the gate structure 210 includes a gate dielectric layer 211 located on the substrate 200 and a gate layer 212 located on the gate dielectric layer 211.

In some implementations, with the gate structure 210 being a polycrystalline silicon gate (poly gate) structure as an example, a material of the gate dielectric layer 211 is silicon oxide, and a material of the gate layer 212 is polycrystalline silicon. In other implementations of the present disclosure, the material of the gate dielectric layer can also be silicon nitride, silicon oxynitride, silicon oxycarbide or a high-k gate dielectric material, and the material of the gate layer can also be metal gate materials such as Al, Cu, Ag, Au, Pt, Ni, Ti, Co or W. The high-k gate dielectric material refers to a gate dielectric material with a relative dielectric constant greater than a relative dielectric constant of silicon oxide.

In some implementations, the gate structure 210 further includes a side wall 213. A material of the side wall 213 can be one or more in silicon oxide, silicon nitride, silicon carbide, silicon carbonitride, silicon oxycarbonitride, silicon oxynitride, boron nitride or boron carbonitride, and the side wall 213 can be of a single-layer structure or a laminated structure. In some implementations, the side wall 213 is of the single-layer structure, and a material of the side wall 213 is silicon oxide.

The drain region 204 is arranged in the drift region 201 on one side of the gate structure 210, and the drain region 204 is isolated from the gate structure 210. The drain region 204 is doped with high-concentration impurities in the first conductive type. In some implementations, the first conductive type is the P type, and the doped impurities in the first conductive type can be boron, gallium, indium or the like.

The isolation structure 260 is further arranged on the substrate 200, and the isolation structure 260 is located between the drain region 204 and the gate structure 210. The isolation structure 260 and the block layer 240 are equivalent to the isolation layer located between the side (a position of a dotted line circle a as shown in FIG. 3), facing the drain region 204, below the groove electrode 250 and the substrate 200. Compared with a scheme that the isolation layer only includes the block layer, due to arrangement of the isolation structure 260, a thickness of the isolation layer between the side, facing the drain region 204, below the groove electrode 250 and the substrate 200 is increased, so that the position is not prone to breakdown, and then a device breakdown voltage is improved.

Besides, due to the arrangement of the isolation structure 260, the thickness of the block layer 240 covering a position above the isolation structure 260 at a corner position of the isolation structure 260 and the substrate 200 is increased, and therefore a hot carrier injection (HCI) effect is improved, and performance of the device is further improved.

In some implementations, the isolation structure 260 is an insulating material and/or a semiconductor material, and an electric field between the drain region 204 and the groove electrode 250 is prevented from being disturbed while a thickness of the isolation layer on a side portion of the groove electrode 250 is increased. In some implementations, when the isolation structure 260 is the insulating material, the material of the isolation structure is one or more of silicon nitride, silicon oxide, silicon oxynitride, silicon oxycarbide, amorphous carbon and silicon oxycarbonitride. When the isolation structure 260 is the semiconductor material, the material of the isolation structure is one or more of silicon, germanium and silicon germanide. When the isolation structure 260 is the insulating material and the semiconductor material, the material of the isolation structure 260 is one or more of silicon nitride, silicon oxide, silicon oxynitride, silicon oxycarbide, amorphous carbon and silicon oxycarbonitride, and one or more of silicon, germanium and silicon germanide. When various types of materials are adopted, the isolation structure 260 can be a laminated layer of a plurality of material layers.

It is not suitable that an interval between the isolation structure 260 and the gate structure 210 is too small or too large. If the interval is too small, the block layer 240 cannot achieve shape-preserving covering in process; and if the interval is too large, a distance between the groove electrode 250 located at the corner position of the isolation structure 260 and the drain region 204 is too small, and thereby an electric field at the position is increased, and therefore breakdown is caused easily. For this purpose, in some implementations, the interval between the isolation structure 260 and the gate structure 210 is 0.5 µm to 1.5 µm. The interval between the isolation structure 260 and the gate structure 210 refers to a distance between adjacent side walls of the isolation structure 260 and the gate structure 210.

It is not suitable that the height of the isolation structure 260 is too small or too large. If the height is too small, the thickness of the isolation layer between the side, facing the drain region 204, of the groove electrode 250 and the substrate 200 cannot be increased; and if the height is too large, the distance between the position and the drain region 204 is too large, and therefore the electric field cannot be effectively shared. For this purpose, in some implementations, the height of the isolation structure 260 is 0.5-1.5 times that of the gate structure 210, and therefore the isolation structure 260 can effectively increase the thickness of the isolation layer between the side (the position of the dotted line a as shown in FIG. 3), facing the drain region 204, of the groove electrode 250 and the substrate 200, and the groove electrode 250 is prevented from being broken down.

The gate electrode 230 electrically connected with the gate structure 210 is arranged on the gate structure 210, and the drain electrode 220 electrically connected with the drain region is arranged on the drain region 204. In some implementations, the gate electrode 230 and the drain electrode 220 are metal electrodes, and are used for achieving electrical connection of the device.

The block layer 240 is arranged between the gate electrode 230 and the drain electrode 220, and the block layer 240 covers the drift region 201 and the isolation structure 260 in the shape-preserving manner. In some implementations, the block layer 240 is a metal silicide block layer, and due to a characteristic that the metal silicide block layer cannot react with metal such as titanium or cobalt, metal silicide is prevented from being formed in part of the region. In some implementations, a material of the metal silicide block layer is silicon oxide.

In some implementations, due to the fact that the block layer 240 covers the isolation structure 260 in the shape-preserving manner, the thickness of the block layer 240 located at the corner position (a position of a dotted line circle b as shown in FIG. 3) of the isolation structure 260 and the substrate 200 is increased, and therefore an HCI effect at the position is improved, and the performance of the device is improved.

The block layer 240 between the isolation structure 260 and the gate structure 210 is provided with the groove electrode 250 at least covering part of the top of the isolation structure 260. The groove electrode 250 is used for being connected with a common electrode or a zero potential. When the device is powered on, a transverse electric field is formed between the groove electrode 250 and the drain region 204, so that the groove electrode 250 shares part of the electric field of the drain region 204, the electric field intensity borne by the gate structure 210 is decreased, and therefore the breakdown voltage is improved.

It can be seen that in some implementations, the isolation structure 260 is arranged between the side (the position of the dotted line circle a as shown in FIG. 3), facing the drain region 204, below the groove electrode 250 and the substrate 200, and the isolation structure 260 and the block layer 240 are equivalent to the isolation layer located between the side, facing the drain region 204, below the groove electrode 250 and the substrate 200. Compared with a scheme that the isolation layer only includes the block layer, due to arrangement of the isolation structure 260, a thickness of the isolation layer between the side, facing the drain region 204, below the groove electrode 250 and the substrate 200 is increased, so that the position is not prone to breakdown, and then a device breakdown voltage is improved.

Besides, in the present disclosure, due to the fact that the groove electrode 250 is not prone to breakdown, the groove electrode 250 further extends to the drain region 204, and therefore a greater transverse width d is arranged, the electric field shared by the groove electrode 250 is further increased, the electric field borne by the gate structure 210 is decreased, and the breakdown voltage of the device improved. In other implementations of the present disclosure, the groove electrode 250 can cover the whole top of the isolation structure 260, so as to improve an extending degree of the groove electrode 250, and therefore the electric field shared by the groove electrode 250 is further increased, the electric field borne by the gate structure 210 is decreased, and the breakdown voltage of the device is improved.

Meanwhile, embodiments and implementations of the present disclosure do not change other parts (such as functional region layout in the substrate, ion implantation concentration of each functional region, and an electrode structure of a gate, source and drain) in a semiconductor structure, and thus Rdson of the device is not increased, so that the Rdson is not increased while the LDMOS device in embodiments and implementations of the present disclosure improve the device breakdown voltage.

Figure 4:
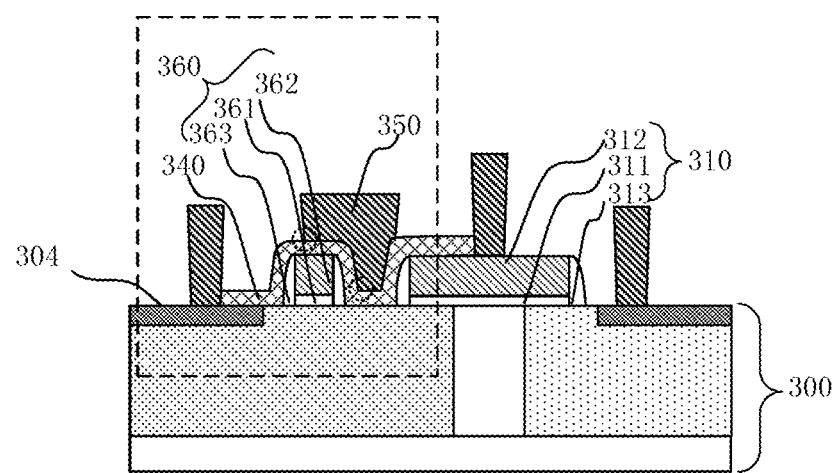
FIG. 4 is a structural schematic view of another form of a LDMOS device.
Figure 5:
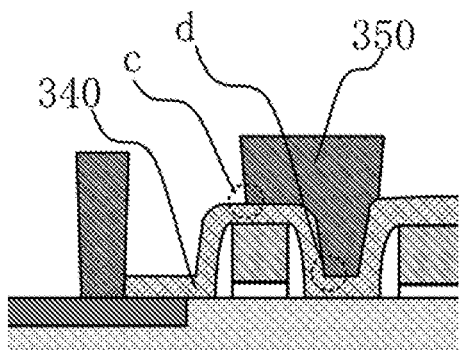
FIG. 5 is a partial enlarged view of a structure in a dotted line frame in FIG. 4.

Referring to FIG. 4 to FIG. 5, FIG. 4 is a structural schematic view of the LDMOS device in another embodiment of the present disclosure, and FIG. 5 is a partial enlarged view of a structure in a dotted line frame in FIG. 4.

Similarities of implementations described below and above-described implementations are not repeated herein. Differences of implementations from the above-described implementations lie in that an isolation structure 360 and a gate structure 310 are the same in structure and material.

Due to the fact that the isolation structure 360 and the gate structure 310 are the same in structure and material, the isolation structure 360 can be formed while the gate structure 310 is formed, and therefore process steps manufacturing the LDMOS device are simplified, process cost is lowered, and manufacturing efficiency is improved.

In some implementations, the gate structure 310 includes a first gate dielectric layer 311 located on a substrate 300 and a first gate layer 312 located on the first gate dielectric layer 311. The isolation structure 360 includes a second gate dielectric layer 361 located on a drift region and a second gate layer 362 located on the second gate dielectric layer 361.

The first gate dielectric layer 311 and the second gate dielectric layer 361 are the same in material. In some implementations, the first gate dielectric layer 311 and the second gate dielectric layer 361 are both a silicon oxide material. In other implementations, a material of any one in the first gate dielectric layer 311 and the second gate dielectric layer 361 can also be dielectric materials such as silicon nitride or silicon oxynitride.

What needs to be explained is that the first gate dielectric layer 311 has good interface quality, and the second gate dielectric layer 361 and the first gate dielectric layer 311 in contact with the substrate 300 in the isolation structure 360 are the same, so that the second gate dielectric layer 361 also has good interface quality, and therefore the HCI effect can be further improved.

The first gate layer 312 and the second gate layer 362 are the same in material. In some implementations, the first gate layer 312 and the second gate layer 362 are both polycrystalline silicon.

What needs to be explained is that the first gate layer 312 has a conductive demand, thus, conductive ions are doped in the first gate layer 312, and the second gate layer 362 has an insulating demand, thus, the second gate layer 362 is an intrinsic material.

Specifically, in the first gate layer 312, impurities in a first conductive type can be doped. In some implementations, the first conductive type is a P type, and the doped impurities in the first conductive type can be boron, gallium or indium or the like.

Due to the arrangement of the isolation structure 360, the isolation structure 360 and the gate structure 310 have the same height, so that the thickness of an isolation layer between a side (a position of a dotted line circle c in FIG. 5), facing a drain region 304, of a groove electrode 350 and a substrate 300 is increased to a maximum extent while forms of the present embodiment simplifies a process, and the breakdown voltage of the device is improved.

In some implementations, the gate structure further includes a first side wall 313, the first side 313 is located on side walls of the first gate dielectric layer 311 and the first gate layer 312. The isolation structure further includes a second side wall 363, and the second side wall 363 is located on side walls of the second gate dielectric layer 361 and the second gate layer 362. The first side wall 313 and the second side wall 363 are the same in material. Specifically, materials of the first side wall 313 and the second side wall 363 are both silicon oxide. Specific description on the first side wall 313 and the second side wall 363 can refer to corresponding description of the side wall in the above-described implementations, and is not repeated herein.

Due to the fact that the isolation structure 360 includes the second side wall 363, a side surface gradient of the isolation structure 360 can be decreased, so that a block layer 340 covering the isolation structure in a shape-preserving manner has a corresponding gradient herein in the meantime. A sharp corner is further prevented from occurring on the groove electrode 350 at a corner position (a position of a dotted line circle d as shown in FIG. 5) of the isolation structure 360 and the substrate 300, so that charge gathering is prevented from being caused, and therefore the breakdown voltage of the groove electrode 350 is further improved.

Besides, due to the fact that a material of the second side wall 363 is silicon oxide, the material is the same as a material adopted by the block layer 340, and therefore it is equivalent to the fact that a thickness of a silicon oxide layer (the position of the dotted line circle d as shown in FIG. 5) at the corner position of the isolation structure 360 and the substrate 300 is further increased, and thus a thickness of an isolation layer between the groove electrode 350 and the substrate 300 is further increased, the HCl effect at the position is improved, and the performance of the device is improved.

Figure 6:
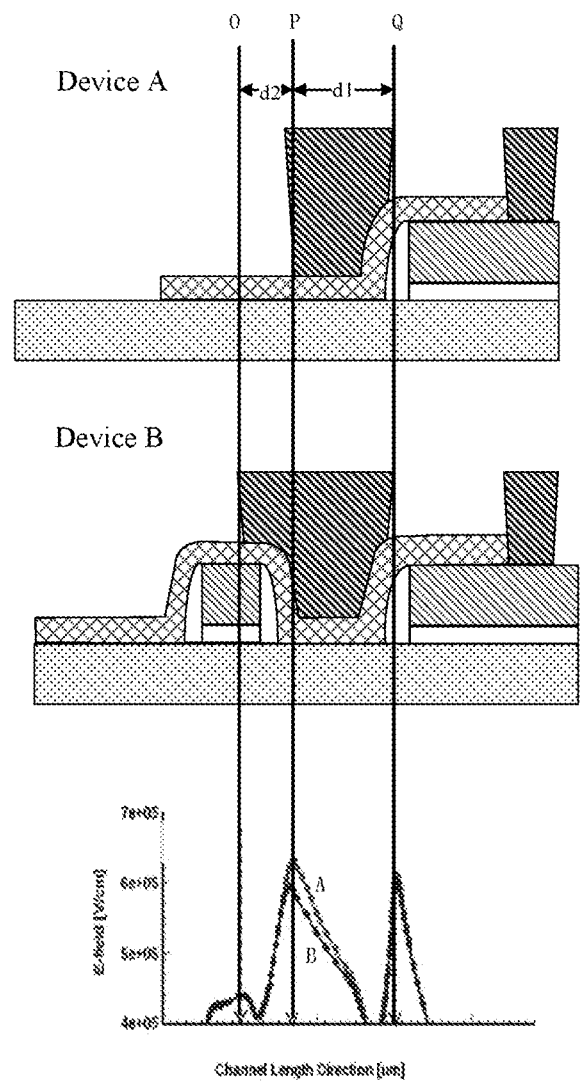
FIG. 6 to FIG. 9 are performance comparison views of the LDMOS device as shown in FIG. 4 and an LDMOS device.

Referring to FIG. 6, it is a distribution comparison view of electric fields below groove electrodes of the LDMOS device of some implementations and an LDMOS device in the prior art. A device A is a structure of the LDMOS device in the prior art, and corresponds to an A curve in a curve view below; and a device B is a structure of the LDMOS device in some implementations, and corresponds to a B curve in the curve view below. The curve view in FIG. 6 is the distribution comparison view of the electric field below the groove electrode, a horizontal coordinate is a groove length, and a vertical coordinate is electric field intensity.

A straight line O corresponds to the position (that is the dotted line circle c position as shown in FIG. 5) of a side, facing a drain region, of the groove electrode in some implementations. Due to the arrangement of the isolation structure at the position, an isolation thickness of the groove electrode at the position and the substrate is increased, thus a greater width can be set for the groove electrode, and more electric fields are shared. With FIG. 6 as an example, a width of a groove electrode in the prior art is a distance d1 between a straight line P and a straight line Q, the width of the groove electrode of the structure of some implementations is a distance between the straight line O and the straight line Q, that is d1+d2, and is greater than that of the groove electrode in the prior art by d2. Therefore more electric field distribution is borne, the electric field shared by the groove electrode 350 in some implementations is increased, and the electric field intensity borne by the gate structure 310 is decreased.

Meanwhile, a greater width is set for the groove electrode 350, distribution of the electric field is further optimized, and a peak value electric field intensity of the groove electrode 350 is decreased. For example, the straight line P corresponds to a peak value position of the electric field, obviously, a peak value of the B curve corresponding to the structure of some implementations is obviously less than that of the A curve corresponding to the prior art.

Figure 7:
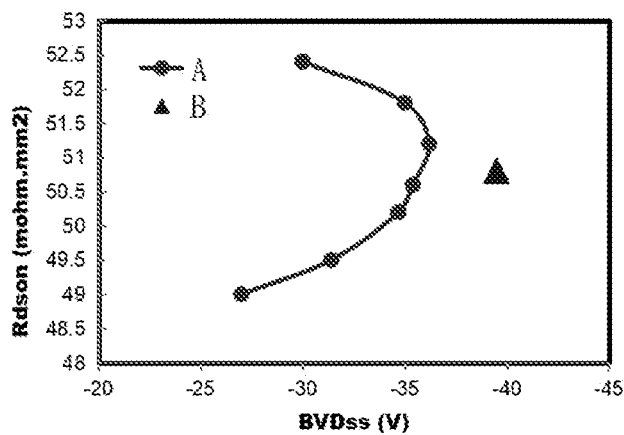

Referring to FIG. 7, FIG. 7 is a comparison view of Rdson and BVDss of the LDMOS devices in the prior art (corresponding to the device A in FIG. 6) and some implementations, where a horizontal coordinate shows the BVDss, a vertical coordinates shows the Rdson, A is a curve view of a device A, B identifies a BVDss value of a device B (the structure of some implementations), and obviously, under the same Rdson, a BVDss value of the device B is greater.

Figure 8:
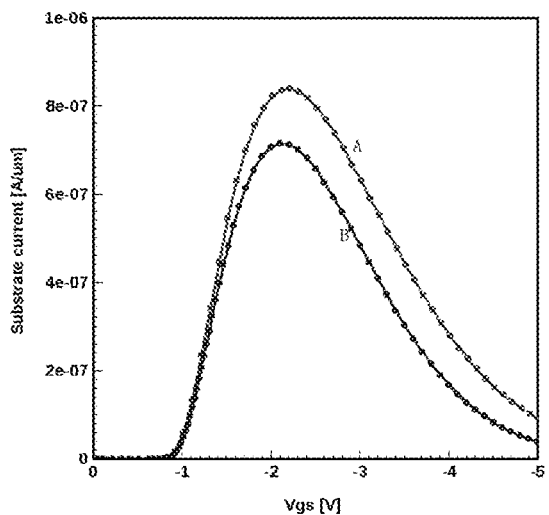

Referring to FIG. 8, FIG. 8 is a comparison view of a gate source voltage (Vgs) and a substrate current of the LDMOS devices in the prior art (corresponding to the device A in FIG. 6) and some implementations, a horizontal coordinate shows the Vgs, a vertical coordinate shows the substrate current, the prior art corresponds to a curve A, some implementations corresponds to a curve B, it can be seen that under the same Vgs, the substrate current of the structure of some implementations is lower, and therefore performance of the device is better.

Figure 9:
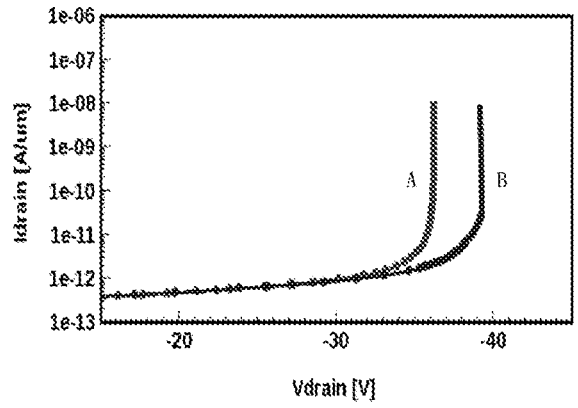

Referring to FIG. 9, FIG. 9 is a comparison view of a drain voltage (Vdrain) and a drain current (Idrain) of the LDMOS devices in the prior art (corresponding to the device A in FIG. 6) and some implementations, the prior art corresponds to a curve A, some implementations corresponds to a curve B, it can be seen that under the same Vdrain, the Idrain of the LDMOS device of some implementations is lower, and therefore performance of the device is better.

Thus, the LDMOS device structure provided by some implementations is higher in breakdown voltage, and better in performance.

Referring to FIG. 10 to FIG. 15, an embodiment of the present disclosure further provides a manufacturing method of an LDMOS device.

Figure 10:
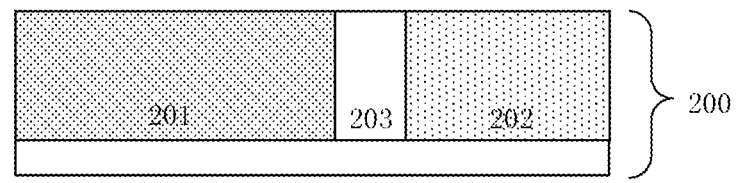
FIG. 10 to FIG. 15 are structural schematic views corresponding to various steps in one form of a manufacturing method of an LDMOS device.

The method includes: referring to FIG. 10, providing a substrate 200, and a drift region 201 formed in the substrate 200.

In some implementations, a material of the substrate 200 is silicon. In some other implementations, the material of the substrate can also be other materials such as germanium, silicon germanide, silicon carbide, gallium arsenide or indium gallium, and the substrate 200 can also be substrates in other types such as a silicon substrate on an insulator or a germanium substrate on the insulator. The substrate can also be a P type substrate or an N type substrate with light doping, and those skilled in the art can perform selection according to actual requirements.

The drift region 201 is formed in the substrate 200, and low-concentration impurities in a first conductive type are doped in the drift region 201. The first conductive type can be any one of an N type or a P type. In some implementations, with a PMOS of the formed LDMOS device as an example, the first conductive type is the P type, and the doped impurities in the first conductive type can be boron, gallium, indium or the like.

Besides, in some implementations, a well region 202 is further formed in the substrate 200, the well region 202 is located on one side of the drift region 201 and isolated from the drift region 201, and low-concentration impurities in a second conductive type are doped in the well region 202.

The second conductive type is opposite to the first conductive type, for example, when the first conductive type is the N type, the second conductive type is the P type. In some implementations, the first conductive type is the P type, and the second conductive type is the N type. The doped impurities in the second conductive type can be phosphorus, arsenic, antimony or the like.

In some implementations, by respectively performing different ion implantation processes, the drift region 201 and the well region 202 are respectively formed. A body region 203 is formed between the drift region 201 and the well region 202, and the body region 203 is a region of the substrate without performing further doping. In other implementations of the present disclosure, there may be no body region arranged between the drift region and the well region.

Figure 11:
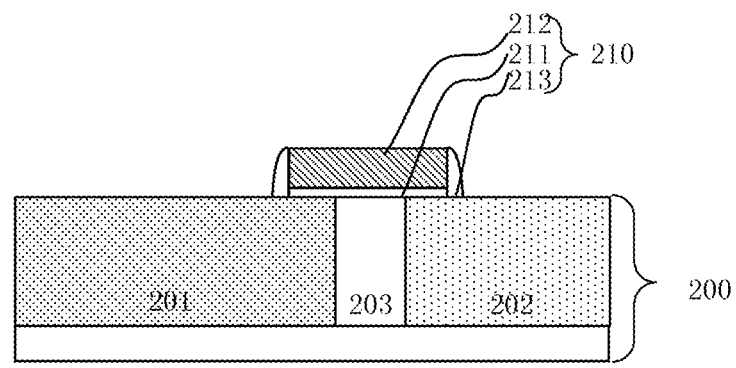

Referring to FIG. 11, forming a gate structure 210 on the substrate 200, the gate structure 210 is located on one side of the drift region 201, and covers part of the drift region 201.

In some implementations, the gate structure 210 includes a gate dielectric layer 211 located on the substrate and a gate layer 212 located on the gate dielectric layer 211.

Specific process steps forming the gate structure include: forming a gate dielectric material layer on the substrate 200; forming a gate material layer on the gate dielectric material layer; and patterning the gate material layer and the gate dielectric material layer, and forming the gate dielectric layer 211 and the gate layer 212.

In some implementations, the gate dielectric layer 211 is silicon oxide, and the gate layer 212 is polycrystalline silicon. In other implementations of the present disclosure, the gate dielectric layer 211 can also be silicon nitride, silicon oxynitride, silicon oxycarbide or a high-k gate dielectric material. The gate layer 212 can also be metal gate materials such as Al, Cu, Ag, Au, Pt, Ni, Ti, Co or W.

In some implementations, the gate structure 210 is located at a junction of the drift region 201 and the well region 202 and covers part of the drift region 201 and part of the well region 202.

In some implementations, the step forming the gate structure 210 further includes: forming a side wall 213 covering the gate dielectric layer 211 and the gate layer 212. Process steps forming the side wall 213 include: forming a side wall material layer covering the substrate 200, the gate layer 212 and the gate dielectric layer 211 in a shape-preserving manner, removing the side wall material layer on the top of the gate layer 212 and on the top of the substrate 200 by adopting an etching process, and forming the side wall 213.

In some implementations, the side wall 213 is silicon oxide. In other implementations of the present disclosure, the side wall 213 can also be one or more of silicon oxide, silicon nitride, silicon carbide, silicon carbonitride, silicon oxycarbonitride, silicon oxynitride, boron nitride and boron carbonitride.

Figure 12:
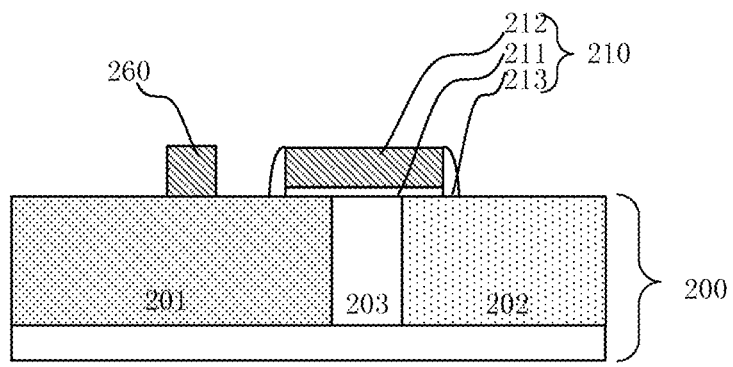

Referring to FIG. 12, the isolation structure 260 is formed on the substrate, and the isolation structure 260 is located on the drift region 201.

In the preset embodiment, the isolation structure 260 is an insulating material and/or a semiconductor material. Specifically, the isolation structure 260 in some implementations is silicon oxide, and is formed through a deposition process and a patterning process.

What needs to be explained is that in some implementations, illustration is performed with the fact that the gate structure 210 is formed first and then the isolation structure 260 is formed as an example. In other implementations, it can also be that after the isolation structure 260 is formed, the gate structure 210 is formed.

Figure 13:
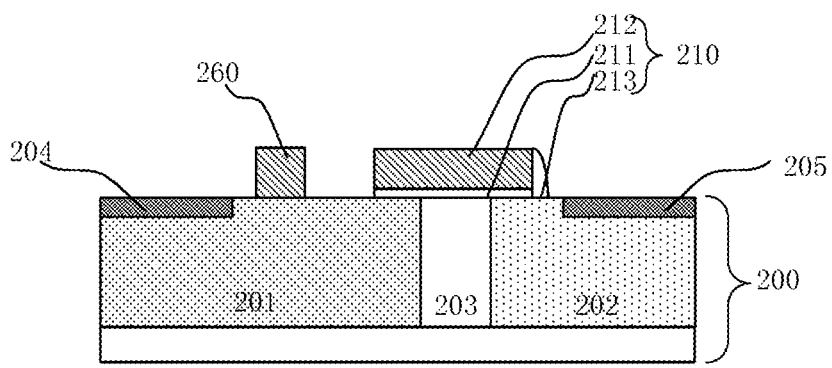

Then, referring to FIG. 13, a drain region 204 is formed in the drift region on one side of the gate structure 210, and the drain region 204 is isolated from the gate structure 210.

High-concentration impurities in a first conductive type are doped in the drain region 204. In some implementations, the first conductive type is a P type, and the doped impurities in the first conductive type can be boron, gallium or indium or the like.

Besides, in this step, forming a source region 205 in the well region 202 on the other side of the gate structure 210 is further included. The source region 205 is doped with the high-concentration impurities in the first conductive type.

In some implementations, by performing doping treatment on part of areas in the drift region 201 and the well region 102, the source region 205 and the drain region 204 are formed.

In some implementations, after the gate structure 210, the isolation structure 260 and the drain region 204 are formed, the isolation structure 260 is located between the gate structure 210 and the drain region 204, so that a thickness of an isolation layer between the subsequently formed groove electrode and the substrate 200 is increased, breakdown is prevented from happening to the groove electrode, and the breakdown voltage of the device is improved.

What needs to be explained is that in other implementations of the present disclosure, the drain region 204 can be formed after the gate structure 210 is formed and before the isolation structure 260 is formed.

Figure 14:
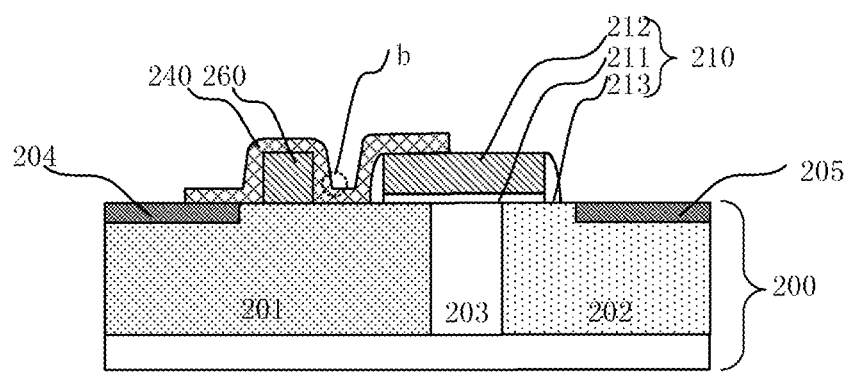

Then referring to FIG. 14, after forming the gate structure 210, the isolation structure 260 and the drain region 204, a block layer 240 covering the drift region 201 and the isolation structure 260 in a shape-preserving manner is formed.

In some implementations, the block layer 240 is a metal silicide block layer, and specifically, a material of the metal silicide block layer is silicon oxide. Due to a characteristic that the metal silicide block layer cannot react with metal such as titanium or cobalt, metal silicide is prevented from being formed in part of the region.

In some implementations, due to the fact that the block layer 240 covers the isolation structure 260 in the shape-preserving manner, a thickness of the block layer 240 located at a corner position (referring to a b position as shown in FIG. 14) of the isolation structure 260 and the substrate 200 is increased, and therefore the HCl effect at the position is improved, and the performance of the device is improved.

Figure 15:
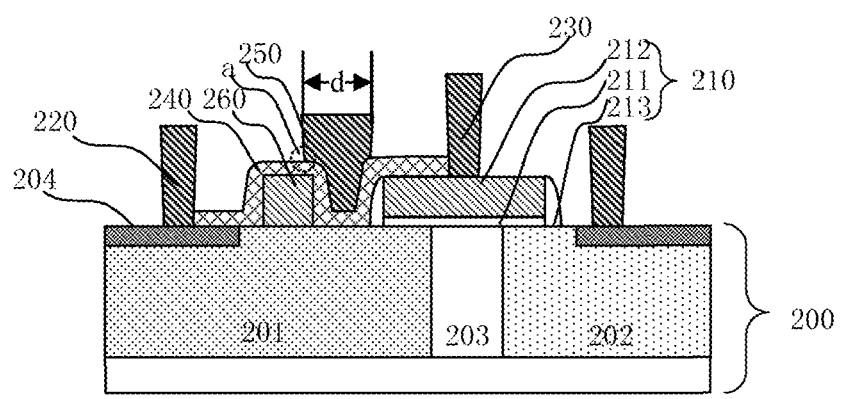

Referring to FIG. 15, a drain electrode 220, a gate electrode 230 and a groove electrode 250 are formed, where the drain electrode 220 is located on the top of the drain region 204 and electrically connected with the drain region 204, the gate electrode 230 is located on the top of the gate structure 210 and electrically connected with the gate structure 210, and the groove electrode 250 is located on the block layer 240 between the isolation structure 260 and the gate structure 210, and at least covers part of the top of the isolation structure 260.

In some implementations, the gate electrode 230, the drain electrode 220 and the groove electrode 250 are all metal electrodes, and are used for achieving electrical connection of the device. The gate electrode 230, the drain electrode 220 and the groove electrode 250 can be formed in the same process step, and specifically, the gate electrode 230, the drain electrode 220 and the groove electrode 250 can be formed by adopting a deposition or sputtering process.

It can be seen that in some implementations, the thickness of the isolation layer between the position (a position of a dotted line circle a as shown in FIG. 15) of the side, facing the drain region 204, of the groove electrode 250 and the substrate 200 is increased, and therefore breakdown is prevented from happening to the position, and the device breakdown voltage is improved.

Besides, in the present disclosure, due to the fact that the groove electrode 250 is not prone to breakdown, a greater width d is arranged for the groove electrode 250, an electric field shared by the groove electrode 250 is further increased, the electric field borne by the gate structure 210 is decreased, and the breakdown voltage of the device is improved. In other implementations of the present disclosure, the groove electrode 250 can cover the whole top of the isolation structure 260, so as to improve an extending degree of the groove electrode 250, and therefore the electric field shared by the groove electrode 250 is further increased, the electric field borne by the gate structure 210 is decreased, and the breakdown voltage of the device is improved.

Meanwhile, the embodiment of the present disclosure does not change a conduction structure when the device runs, and thus Rdson of the device cannot be increased, so that the Rdson cannot be increased while the LDMOS device in the embodiment of the present disclosure improves the device breakdown voltage.

Figure 16:
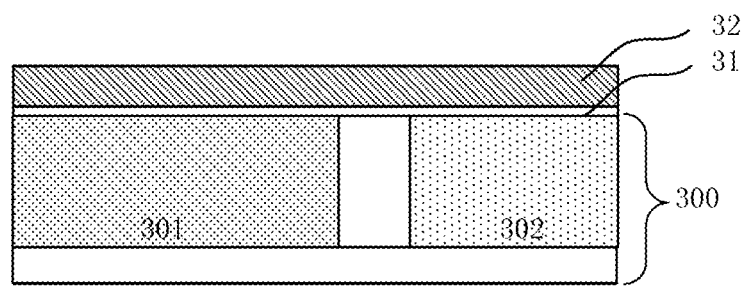
FIG. 16 to FIG. 18 are structural schematic views corresponding to various steps in another form of a manufacturing method of an LDMOS device.
Figure 17:
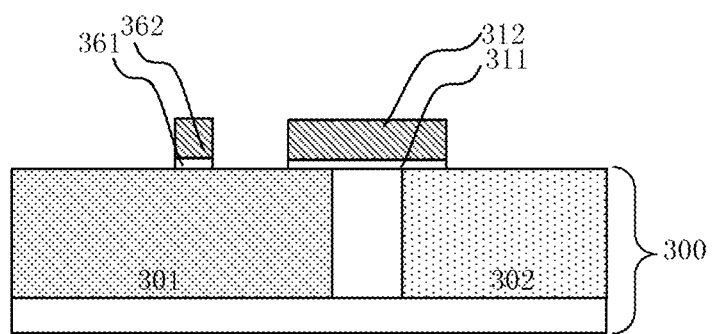
Figure 18:
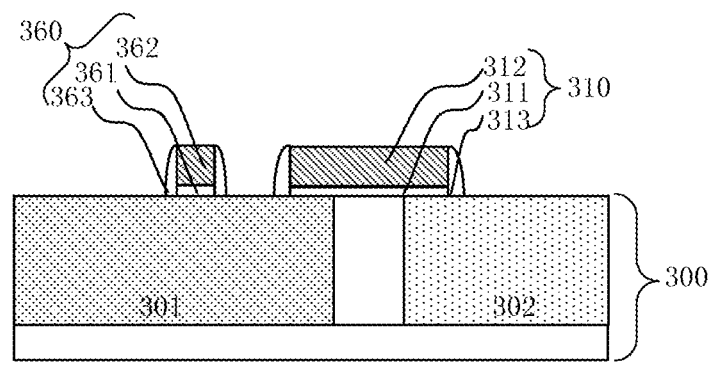

In another embodiment of the present disclosure, another manufacturing method of an LDMOS device is further provided. FIGS. 16 to 18 are structural schematic views corresponding to various steps in the manufacturing method of an LDMOS device in another embodiment of the present disclosure.

Similarities of the presently-described implementations and the above-described implementations are not repeated herein. The difference of the presently-described implementations from the above-described implementations lies in that in the step of forming a gate structure 310, an isolation structure 360 is formed at the same time.

Due to the fact that in the step of forming the gate structure 310, the isolation structure 360 is formed at the same time, process steps are simplified, and process cost is lowered.

Specifically, that in the step of forming the gate structure 310, the isolation structure 360 is formed at the same time includes:

Referring to FIG. 16, after a drift region 301 and a well region 302 are formed, a gate dielectric material layer 31 is formed on a substrate 300, and a gate material layer 32 is formed on the gate dielectric material layer 31.

A forming process of the gate dielectric material layer 31 and the gate material layer 32 is the same as a process forming the gate structure in the previous implementations, and is not repeated herein.

Referring to FIG. 17, the gate material layer 32 and the gate dielectric material layer 31 are patterned, and a first gate dielectric layer 311 and a second gate dielectric layer 361 which are discrete, and a first gate layer 312 located on the first gate dielectric layer 311 and a second gate layer 362 located on the second gate dielectric layer 361 are formed, the first gate dielectric layer 311 and the first gate layer 312 form the gate structure 310, and the second gate dielectric layer 361 and the second gate layer 362 form the isolation structure 360.

What needs to be explained is that the first gate dielectric layer 311 has good interface quality, the second gate dielectric layer 361 and the first gate dielectric layer 311 in contact with the substrate 300 in the isolation structure 360 are formed in the same step by adopting the same process, so that the second gate dielectric layer 361 also has good interface quality, and therefore the HCI effect can be further improved.

What needs to be explained is that the first gate layer 312 has a conductive demand, thus, after the gate material layer 32 and the gate dielectric material layer 31 are patterned, and before the block layer is formed, performing doping treatment on the first gate layer 312 is further included.

Specifically, a process of performing doping on the first gate layer 312 includes: forming a mask layer on the substrate 300, the mask layer exposing the top of the first gate layer 312 and covering the isolation structure 360; using the mask layer as a mask, implanting doping ions in the first gate layer 312; and removing the mask layer.

Specifically, impurities in a first conductive type are doped in the first gate layer 312. In some implementations, the first conductive type is a P type, and the doped impurities in the first conductive type can be boron, gallium, or indium or the like.

In some implementations, the second gate layer 362 has an insulating demand, and thus no doping is performed on the second gate layer 362 in this step.

Referring to FIG. 18, what needs to be explained is that a step of forming the gate structure 310 and the isolation structure 360 further includes: forming a first side wall 213 on side walls of the first gate layer 312 and the first gate dielectric layer 311, and forming a second side wall 363 on side walls of the second gate layer 362 and the second gate dielectric layer 361. The first side wall 313 and the second side wall 363 are formed by adopting the same process so as to simplify the process.

The specific process step includes: forming a side wall material layer covering the substrate 300, the first gate layer 312, the first gate dielectric layer 311, the second gate layer 362 and the second gate dielectric layer 361 in a shape-preserving manner, and etching and removing the side wall material layer on the top of the substrate 300, on the top of the first gate layer 312 and on the top of the second gate layer 362, and reserving a remaining side wall material layer to serve as the side wall. The side wall covers the side walls of the first gate layer 312 and the first gate dielectric layer 311, and further covers the side walls of the second gate layer 362 and the second gate dielectric layer 361.

In some implementations, the isolation structure 360 and the gate structure 310 are the same in structure and material, the isolation structure can be formed while the gate structure 310 is formed, and therefore process steps are simplified, and process cost is lowered.

Due to the fact that the isolation structure 360 includes the second side wall 363, a side surface gradient of the isolation structure 360 can be decreased, so that a block layer 340 covering the isolation structure in a shape-preserving manner has a corresponding gradient herein in the meantime. A sharp corner is further prevented from occurring on a groove electrode 350 at a corner position (referring to the position of the dotted line circle d in FIG. 5) of the isolation structure 360 and the substrate 300, so that charge gathering is prevented from being caused, and the breakdown voltage of the groove electrode 350 is further improved.

Besides, due to the fact that a material of the second side wall 363 is silicon oxide, the material is the same as the material adopted by the block layer 340, and therefore it is equivalent to the fact that the thickness of a silicon oxide layer (the position of the dotted line circle d as shown in FIG. 5) at the corner position of the isolation structure 360 and the substrate 300 is further increased. Therefore, a thickness of an isolation layer between the groove electrode 350 and the substrate 300 is further increased, the HCl effect at the position is improved, and the performance of the device is improved.

Steps before the gate structure 310 and the isolation structure 360 are formed in presently-described implementations and subsequent steps are the same as the steps in the above-described implementations, and specific description on the manufacturing method can refer to corresponding description in the above-described implementations, and is not repeated herein.

The present disclosure describes a plurality of implementations, where selectable manners introduced in the implementations can be mutually combined and crossed for reference under the condition that no conflict is involved. Therefore, various possible implementations are achieved in an extending manner, and can also be thought of as implementations disclosed by the present disclosure.

Although what is disclosed in the present disclosure is as above, the present disclosure is not limited herein. One of skill in the art can make various alternations and modifications without breaking away from the spirit and scope of the present disclosure.

What is claimed is:

1. A Laterally Diffused Metal Oxide Semiconductor (LDMOS) device, comprising:
    a substrate with a drift region formed in the substrate;
    a gate structure, located on the substrate on one side of the drift region, and covering part of the drift region;
    a drain region, located in the drift region on one side of the gate structure;
    an isolation structure located on the substrate, the isolation structure located between the drain region and the gate structure and separated from the drain region and the gate structure;
    a gate electrode, located on the gate structure and electrically connected with the gate structure;
    a drain electrode, located on the drain region and electrically connected with the drain region;
    a block layer, conformally covering the drift region and a top of the isolation structure between the gate electrode and the drain electrode; and
    a groove electrode located on the block layer, the groove electrode located between the isolation structure and the gate structure, and at least covering part of the top of the isolation structure.

2. The LDMOS device according to claim 1, wherein a material of the isolation structure is at least one of an insulating material or a semiconductor material.

3. The LDMOS device according to claim 2, wherein the isolation structure and the gate structure are the same in structure and material.

4. The LDMOS device according to claim 3, wherein:
    the gate structure comprises: a first gate dielectric layer located on the substrate and a first gate layer located on the first gate dielectric layer; and
    the isolation structure comprises: a second gate dielectric layer located on the drift region and a second gate layer located on the second gate dielectric layer,
    wherein a material of the second gate layer is an intrinsic material.

5. The LDMOS device according to claim 4, wherein the gate structure further comprises: a first side wall, located on side walls of the first gate dielectric layer and the first gate layer; and
    the isolation structure further comprises: a second side wall, located on side walls of the second gate dielectric layer and the second gate layer.

6. The LDMOS device according to claim 1, wherein an interval of the isolation structure and the gate structure is 0.5 micron to 1.5 microns.

7. The LDMOS device according to claim 1, wherein the height of the isolation structure is 0.5 time to 1.5 times that of the gate structure.

8. The LDMOS device according to claim 1, wherein the groove electrode covers the entire top of the isolation structure.

9. The LDMOS device according to claim 1, wherein the block layer is a metal silicide block layer.

* * * * *